United States Patent
Inoue et al.

(10) Patent No.: US 6,328,201 B1
(45) Date of Patent: Dec. 11, 2001

(54) MULTILAYER WIRING SUBSTRATE AND METHOD FOR PRODUCING THE SAME

(75) Inventors: Yasushi Inoue; Masakazu Sugimoto, both of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/636,710

(22) Filed: Aug. 11, 2000

Related U.S. Application Data

(62) Division of application No. 09/151,520, filed on Sep. 11, 1998, now Pat. No. 6,159,586.

(30) Foreign Application Priority Data

Sep. 25, 1997 (JP) ..................................... 9-260201

(51) Int. Cl.[7] ........................... B23K 31/00; B23K 31/02; B31B 1/64; B32B 31/00; H01L 21/44
(52) U.S. Cl. ................ 228/248.1; 228/175; 228/180.22; 156/60; 156/288; 438/613
(58) Field of Search .............................. 228/248.1, 248.5, 228/175, 180.22; 156/60, 288; 257/737; 438/613

(56) References Cited

U.S. PATENT DOCUMENTS

| 3,795,047 | | 3/1974 | Abolafia et al. . |
| 4,648,179 | | 3/1987 | Bhattacharyya et al. . |
| 5,252,519 | * | 10/1993 | Nakatani . |
| 5,374,469 | | 12/1994 | Hino et al. . |
| 5,444,189 | * | 8/1995 | Nakaso et al. . |
| 5,744,758 | * | 4/1998 | Takenouchi et al. . |

(List continued on next page.)

FOREIGN PATENT DOCUMENTS

| 0 533 198 A2 | | 3/1993 | (EP) . |
| 0 607 534 A2 | | 7/1994 | (EP) . |
| 000905763A2 | * | 3/1999 | (EP) . |
| 61-212096 | | 9/1986 | (JP) . |
| 5-183275 | | 7/1993 | (JP) . |
| 6-53684 | | 2/1994 | (JP) . |
| 6-268381 | | 9/1994 | (JP) . |
| 411145622A | * | 5/1999 | (JP) . |
| 411163522A | * | 6/1999 | (JP) . |
| 02001028481A | * | 1/2001 | (JP) . |
| 02001028482A | * | 1/2001 | (JP) . |
| 02001077533A | * | 3/2001 | (JP) . |
| WO 95/11582 | | 4/1995 | (WO) . |

OTHER PUBLICATIONS

US 2001/0004944A1 (Jun. 28, 2001). Nakamura et al.*

*Primary Examiner*—Tom Dunn
*Assistant Examiner*—Kiley Stoner
(74) *Attorney, Agent, or Firm*—McGuireWoods LLP

(57) ABSTRACT

A multilayer wiring substrate which can be produced by a simple method and has a high connection reliability is disclosed. The multilayer wiring substrate is produced by the steps of: preparing a plurality of double-sided circuit substrates each comprising an insulating layer which comprises an organic high molecular weight resin having formed on both surfaces thereof wiring conductors, both the wiring conductors being electrically connected by a throughhole, and an adhesive sheet having holes at positions corresponding to the definite portions of the wiring conductors of the double-sided circuit substrates; temporarily adhering the adhesive sheet to the double-sided circuit substrates in the state that the holes of the adhesive sheet are position-matched with the definite portions of the wiring conductors of the double-sided circuit substrates, filling up the holes of each adhesive sheet with a solder paste and heat-melting the solder paste to form a solder bump; and position-matching such that the wiring conductors of the double-sided circuit substrates can be electrically connected in the predetermined manner, piling up the double-sided circuit substrates, and then heat-pressing the resulting assembly to integrate the assembly in a body.

6 Claims, 7 Drawing Sheets

U.S. PATENT DOCUMENTS

| | | |
|---|---|---|
| 5,768,108 | 6/1998 | Miura et al. . |
| 5,822,856 * | 10/1998 | Bhatt et al. . |
| 5,876,842 | 3/1999 | Duffy et al. . |
| 6,159,586 * | 12/2000 | Inoue et al. . |
| 6,217,987 * | 4/2001 | Ono et al. . |
| 6,237,218 * | 5/2001 | Ogawa et al. . |
| 6,242,079 * | 6/2001 | Mikado et al. . |
| 6,248,428 * | 6/2001 | Asai et al. . |

* cited by examiner

MULTILAYER WIRING SUBSTRATE AND METHOD FOR PRODUCING THE SAME

The present application is a divisional application of application of U.S. application Ser. No. Ser. No. 09/151,520 filed on Sep. 11, 1998, now U.S. Pat. No. 6,159,586.

FIELD OF THE INVENTION

The present invention relates to a multilayer wiring substrate suitable for mounting a semiconductor chip, etc., and a method for producing the same.

BACKGROUND OF THE INVENTION

Recently, with small-sizing and increasing the performance of electronic instruments, small-sizing and thinning, increasing the performance, and high reliability have been required for semiconductor devices constituting electronic instruments and multilayer print wiring substrates for mounting them. Due to those requirements, the mounting method is shifted from a pin-insertion type packing to a surface mounting type packaging. Recently, a mounting method called bare chip mounting which directly mounts a semiconductor chip on a printed substrate has been investigated. Also, with increasing the number of pins of a semiconductor chip, the necessity of using a multilayer of a substrate for mounting the semiconductor element has been increased. A method of forming a multilayer substrate is proposed, wherein a multilayer wiring substrate of a build-up system is formed by alternately piling up each insulating layer using a photosensitive resin and each conductive layer formed by plating or a vapor deposition, on one surface or both surfaces of a substrate. However, such a multilayer wiring substrate has the problems that the production steps are complicated, the number of steps is increased, the yield is low, the time of delivery is long, and the like. Also, a method of forming a multilayer substrate by forming an electrically conductive paste as projections by dispenser, etc., on one surface (copper-clad surface) of a glass and epoxy one-surface copper-clad laminate plate, laminating an adhesive sheet and a copper foil thereon, pressing the assembly, and repeating the procedure is proposed as disclosed in JP-A-8-288649 (the term "JP-A" as used herein means an "unexamined published Japanese patent application"). However, this method has problems in the reliability of connection, the connection resistance, etc. This method also has various problems that it is difficult to apply to fine circuits and also it is necessary to repeat pressing the required number of the layers for the formation of a multilayer structure, which requires increased time for the production.

On the other hand, the bare chip mounting involves adhering a silicon chip having a thermal expansion coefficient of from 3 to 4 ppm/° C. to a printed substrate having a thermal expansion coefficient of from 10 to 20 ppm/° C. directly via an adhesive. Therefore, a problem arises that a stress is applied due to the difference in the thermal expansion coefficients, thereby decreasing the connection reliability. Further, the stress causes the problem such that cracks occur in the adhesive to decrease moisture resistance. To relax such a stress, a method of, for example, attempting diffusion of the stress by decreasing a modulus of elasticity of the adhesive have been practiced. However, even by these methods, the connection reliability cannot sufficiently be ensured, and to ensure a higher connection reliability, it is necessary and indispensable to decrease the thermal expansion coefficient of the substrate itself. To overcome this problem, a multilayer wiring substrate using a Ni—Fe alloy as a plate and alternately piling up thereon each insulating layer and each wiring conductor, or a multilayer wiring substrate obtained by forming a solder pad on the surface layer of the above-described multilayer wiring substrate by a photoetching method followed by heat-pressing to integrate them in a body is proposed as disclosed in JP-A-61-212096.

However, when copper is used as the wiring electric conductor in these multilayer wiring plates, the modulus of elasticity of the copper is very large as compared with the modulus of elasticity of a polyimide resin constituting the insulating layer. Therefore, it is difficult to decrease the thermal expansion coefficient of the entire multilayer wiring plate as that of silicon constituting a semiconductor chip. Also, since a metal thin-film forming technique such as a vapor deposition method, a sputtering method, etc., is used, the productivity is low and the production cost increases. Furthermore, a solder pad is formed by a vapor deposition method or a photoetching method, so that a complicated step is required.

SUMMARY OF THE INVENTION

The present invention has been made in view of the above circumstances.

One object of the present invention is to provide a multilayer wiring substrate which can be easily produced and has a high connection reliability.

Another object of the present invention is to provide a method for producing the multilayer wiring substrate.

According to a first embodiment of the present invention, there is provided a multilayer wiring substrate comprising a plurality of double-sided circuit substrates each comprising an insulating layer which comprises an organic high molecular weight resin having formed on both surfaces thereof a wiring conductor, the wiring conductors on both surfaces being electrically connected by a throughhole, wherein the double-sided circuit substrates are laminated through an adhesive layer in a body, holes are formed in the adhesive layer at predetermined positions of the portions which contact the wiring conductors of the two double-sided circuit substrates sandwiching the adhesive layer therebetween, a solder-made electric conductor is formed in the hole, and the wiring conductors of the two double-sided circuit substrates are electrically connected each other by the solder-made electric conductor.

According to a second embodiment of the present invention, there is provided a method of producing the multilayer wiring substrate, which comprises the steps of:

preparing a plurality of double-sided circuit substrates each comprising an insulating layer which comprises an organic high molecular weight resin having formed on both surfaces thereof wiring conductors, both the wiring conductors being electrically connected by a throughhole, and an adhesive sheet having holes at positions corresponding to the predetermined portions of the wiring conductors of the double-sided circuit substrates;

temporarily adhering the adhesive sheet to the double-sided circuit substrates in the state that the holes of the adhesive sheet are position-matched with the predetermined portions of the wiring conductors of the double-sided circuit substrates, filling up the holes of each adhesive sheet with a solder paste and heat-melting the solder paste to form a solder bump; and position-matching such that the wiring conductors of the double-sided circuit substrates can be electrically connected in the predetermined manner, piling up the double-sided circuit substrates, and then heat-pressing the resulting assembly to integrate the assembly in a body.

As a result of a series of investigations to obtain a multilayer wiring substrate which can be easily produced and has a high connection reliability, it has been found that a multilayer wiring substrate can be easily produced by the above-described production method, and the multilayer wiring substrate obtained has a high connection reliability. The present invention has been completed based on this finding.

According to the method of the present invention, the adhesive sheet is temporarily adhered to the double-sided circuit substrates after position-matching, a solder bump is formed in the holes formed in the adhesive sheet, and the double-sided circuit substrates are piled up with position-matching followed by heat-pressing to integrate the entire assembly in a body. Therefore, a plurality of double-sided circuit substrates can be integrated in a body by one heat-pressing. Simultaneously, regardless of the number of layers of the wiring conductors, the electric connection between the wiring conductors can be performed by the one heat-pressing. Further, through holes are formed in each double-sided circuit substrate and the wiring conductors at both surfaces of each double-sided wiring substrate are electrically connected. Therefore, the electric connection in each wiring conductor can be performed at an optional position by optionally setting the position of the throughholes and the position of the solder electric conductors. In the present invention, the term "prepare an adhesive sheet having holes at a position corresponding to the predetermined position of the wiring conductor of the double-sided circuit substrate" means to include the embodiment that the holes are formed after placing the adhesive sheet on the double-sided circuit substrate.

In the present invention, where the insulating layer contains a Ni—Fe-based alloy foil, a titanium foil or a ceramic material as a core material, the core material having a low thermal expansion coefficient comprising the Ni—Fe-based alloy foil, the titanium foil or the ceramic material is contained at a rate of one layer to two layers of the wiring conductors. As a result, where copper is used as the wiring conductors, it becomes possible to approach the thermal expansion coefficient of the entire multilayer substrate to that of silicon as close as possible. Thus, where the Ni—Fe-based alloy foil, the titanium foil or the ceramic material is contained in the insulating layer as the core material, the thermal expansion coefficient can be greatly decreased, so that the multilayer circuit substrate has a very high connection reliability even in the case of bare chip mounting.

DETAILED DESCRIPTION OF THE INVENTION

Figure 1:
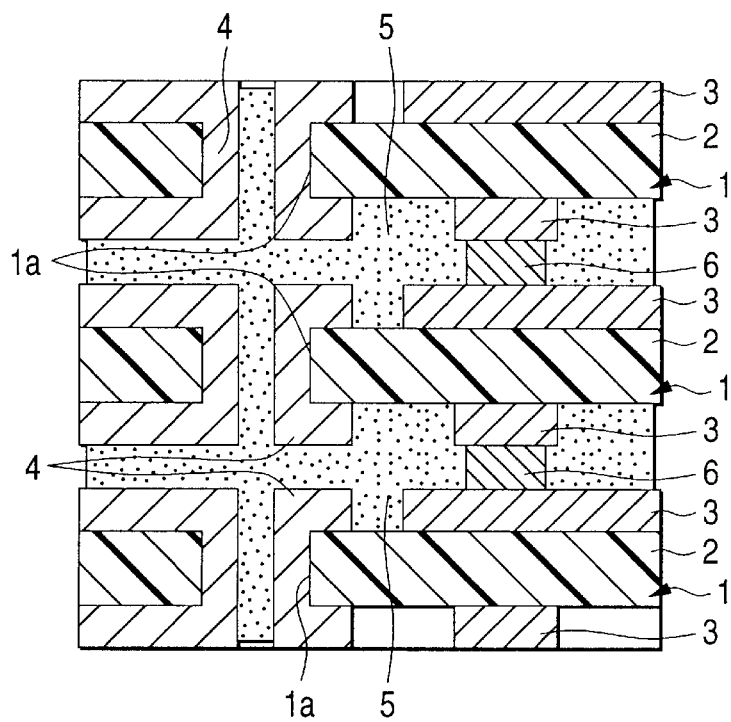
FIG. 1 is a cross-sectional view showing one practical embodiment of the multilayer wiring substrate of the present invention.

The present invention is described in detail below.

The method for producing the multilayer circuit substrate of the present invention uses insulating layers comprising a high molecular weight material, double-sided circuit substrates each comprising the insulating layer having formed on both surfaces thereof a wiring conductor, adhesive sheets, and solder pastes.

The organic high molecular weight material constituting the insulating layers used is preferably a polyimide-based resin, but the organic high molecular weight material is not limited to this resin. Polyether imide, polyether sulfone, an epoxy-based resin, a phenol-based resin, a fluorine-based resin, etc., can also be used.

A metal material constituting the wiring conductors used is preferably copper, but the metal material is not limited to copper. Gold, silver, etc., are also used.

The adhesive sheet forms an insulating layer after laminating in a body. Therefore, an adhesive constituting the adhesive sheet is preferably a polyimide-based adhesive or a mixed adhesive thereof from the points of the heat resistance, the electric characteristics, etc. However, an epoxy-based adhesive, a polyether imide-based adhesive, a phenol-based adhesive, etc., may be used. The thickness of the adhesive sheet is preferably 0.01 to 1.0 mm, If the thickness is smaller than 0.01 mm, the workability becomes poor and also it is impossible to fill the unevenness between the circuits, and the throughholes. On the other hand, if the thickness is larger than 1.0 mm, it is difficult to well fill up the hole with a solder, decreasing the reliability of the multilayer circuit substrate. A means for forming a hole in the adhesive sheet can use the conventional technique such as drilling or punching.

The solder paste can use commercially available solder pastes. Particle size of the solder particles is 100 μm or less, preferably 50 μm or less, and more preferably 20 μm or less. Composition of the solder is not particularly limited, and the composition may be selected according to the heat resistance required for the substrate. The solder bump after lamination passes an electric current by contacting with a counter electrode. If necessary, metal joining may be made by heating the substrate to a temperature higher than the melting point of the solder. The metal joining may be carried out simultaneously with the integration of the substrates in a body by heat-pressing or may be carried out by heating again after integrating in a body.

An Ni—Fe-based alloy foil, a titanium foil or a ceramic material sheet can be disposed as a core material in the insulating layer in order to decrease the thermal expansion coefficient of the substrate (the thermal expansion coefficient of the entire multilayer wiring substrate approaches that of silicon as close as possible). The Ni—Fe-based alloy foil, titanium foil or ceramic material sheet acts to restrain the expansion of the conductor layer and the insulating layer. Therefore, it is required for the thermal expansion coefficient of the Ni—Fe-based alloy foil, titanium foil or ceramic material sheet itself to be sufficiently small.

Where the core material is Ni—Fe-based alloy, the thermal expansion coefficient thereof varies depending on the compositional proportion of the Ni—Fe-based alloy. Therefore, the Ni content is 31 to 50% by weight, and preferably 31 to 45% by weight. If the Ni content is larger or smaller than this range, the thermal expansion coefficient of the alloy increases, and it is difficult to suppress the thermal expansion coefficient of the entire multilayer wiring substrate.

Where the titanium foil is used as the core material, the titanium foil used includes a commercially available pure titanium foil and titanium alloy foil. The titanium alloy used is alloys comprising Ti as the main component and metals such as Al, V, Cr, Mn, Sn or Zr compounded therewith. These titanium foils have thermal expansion coefficient of about 8.8 to 9.0 ppm/° C. and have the characteristic that the specific gravity is about 4.5 and thus the weight per volume is light. On the other hand, the ceramic material used includes alumina, mullite, cordierite, silicon carbide, silicon nitride, aluminum nitride, zirconia, etc., or a mixture of them.

The thickness of the core material is preferably 10 to 300 μm. If the thickness is smaller than 10 μm, it is difficult to restrain the thermal expansion coefficient of the multilayer circuit substrate. On the other hand, if the thickness exceeds 300 μm, the workability is decreased and also the reliability of throughhole plating is decreased.

The method of electrically connecting both the conductor layers at both surfaces of the double-sided circuit substrate using the Ni—Fe-based alloy foil, titanium foil or ceramic material sheet as the core material is carried out by conventional throughhole plating.

The practical embodiment of the present invention is described based on the accompanying drawings.

FIG. 1 shows one embodiment of the multilayer wiring substrate of the present invention. In FIG. 1, 1 is a double-sided circuit substrate comprising an insulating layer 2 made up of a polyimide resin having formed on both surfaces thereof a circuit (wiring conductor) 3 made up of a copper foil. In this embodiment, three double-sided circuit substrates 1 are used, thereby six-layer wiring substrate is prepared as the multilayer wiring substrate. Reference numeral 4 is a throughhole plated portion formed by applying a copper plating to a hole 1a formed in each double-sided circuit substrate 1, and circuits 3 at both the surfaces of each substrate are electrically connected. 5 is polyimide-based adhesive layers each adhering two double-sided circuit substrates 1. Reference numeral 6 is solder-made conductors each electrically connecting the circuits 3 of the two double-sided circuit substrates neighboring up and down.

Figure 2:
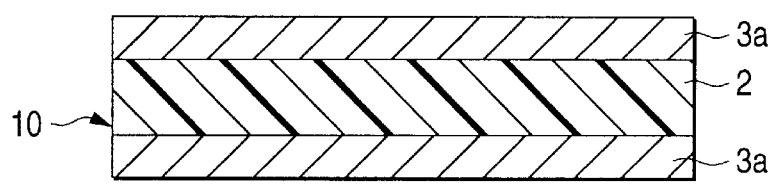
FIG. 2 is a cross-sectional view of the substrate.
Figure 3:
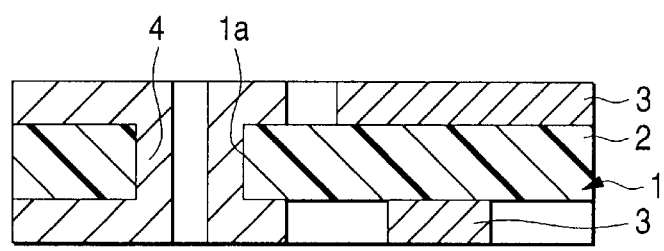
FIG. 3 is a cross-sectional view of the double-sided circuit substrate.
Figure 4:
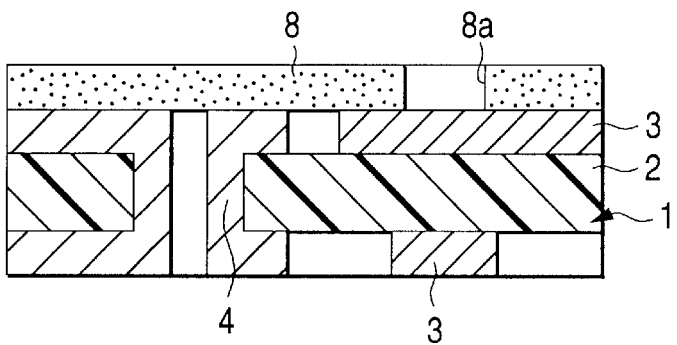
FIG. 4 is a cross-sectional view showing the state that an adhesive sheet is temporarily adhered to a double-sided circuit substrate.

The multilayer wiring substrate can be produced as follows. Three substrates 10 each comprising an insulating layer 2 made up of a polyimide resin having formed on both the surfaces thereof a conductive layer 3 made up of a copper foil (see FIG. 2) and two adhesive sheets 8 each made up of a polyimide-based adhesive (see FIG. 4) are prepared. In each of the two adhesive sheets 8, a hole 8a is formed at a predetermined position (the position of forming the solder-made conductor 6 of FIG. 1). As shown in FIG. 3, a hole 1a is formed by drilling, etc., at a predetermined position of each substrate 10, a throughhole plating of copper is applied to the hole 1a to form a throughhole plated portion 4, and a circuit 3 is formed on each conductor layer 3a at both the surfaces of each substrate 10 by a conventional etching method to produce three double-sided circuit substrates 1. As shown in FIG. 4, each adhesive sheet 8 is temporarily adhered on the upper surface of each of two (in three) double-sided circuit substrates 1 while position-matching the hole portion 8a of each adhesive sheet 8 to a predetermined position (the position of forming the solder-made conductor 6 of FIG. 1) of the circuit 3 of each of the double-sided circuit substrates 1. A solder paste is then placed in the hole portion 8a of each of the adhesive sheets 8 by screen printing and melted by heating to form a solder bump 9 on the circuit 3 of each double-sided circuit substrate 1. After piling up two double-sided circuit substrates 1 each having formed thereon a solder bump 9 and one double-sided circuit substrate 1 having formed thereon a circuit 3 by position-matching (see FIG. 6), the assembly is integrated in a body by heat-pressing. In this state, each adhesive sheet 8 becomes an adhesive layer 5 and each solder bump 9 becomes a solder conductor 6. Thus, a six-layer wiring substrate wherein three double-sided circuit substrates 1 are laminated in a body can be obtained.

As described above, in this practical embodiment, three double-sided circuit substrates can be integrated in a body by one heat-pressing, and at the same time, the electric connection of circuits 3 of six layers (electric connection among six layers) can be performed. Further, because of use of a solder, connection between the layers each having a low resistance can be carried out. Furthermore, since a through hole plated portion 4 is formed at each double-sided circuit substrate 1, the electric connection among six layers can be carried out at desired positions by desirably setting the position of each throughhole plated portion 4 and the position of each solder-made conductor 6, whereby the degree of freedom of the design is greatly increased.

Figure 7:
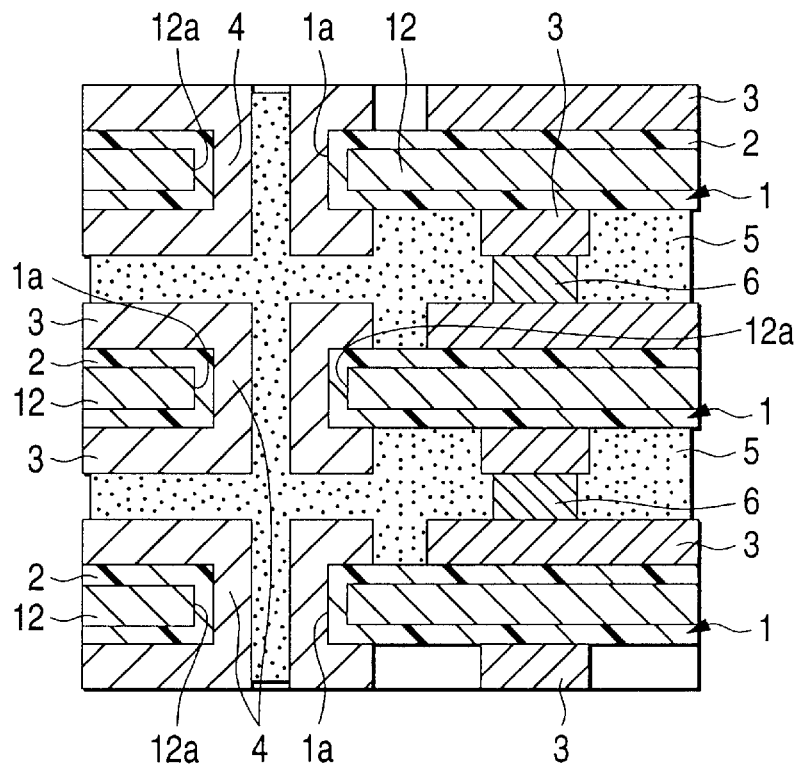
FIG. 7 is a cross-sectional view showing another embodiment of the multilayer wiring substrate of the present invention.

FIG. 7 shows another embodiment of the multilayer wiring substrate of the present invention. In this embodiment, an Ni—Fe-based alloy foil 12 is disposed in an insulating layer 2 of each double-sided circuit substrate 1 as a core material. Other portions are same as those of the multilayer wiring substrate shown in FIG. 1, and the same portions are shown by the same reference number as in FIG. 1.

Figure 5:
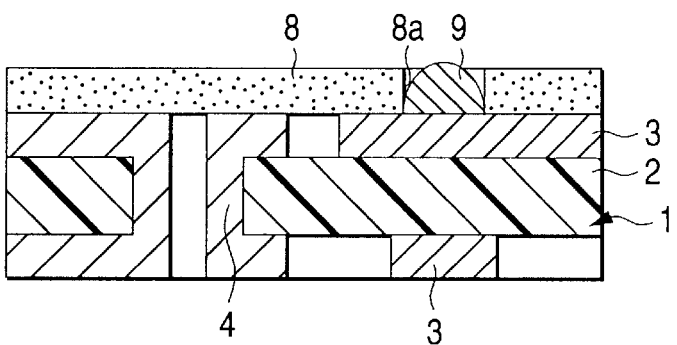
FIG. 5 is a cross-sectional view showing the state that a solder bump is formed in an adhesive sheet.
Figure 6:
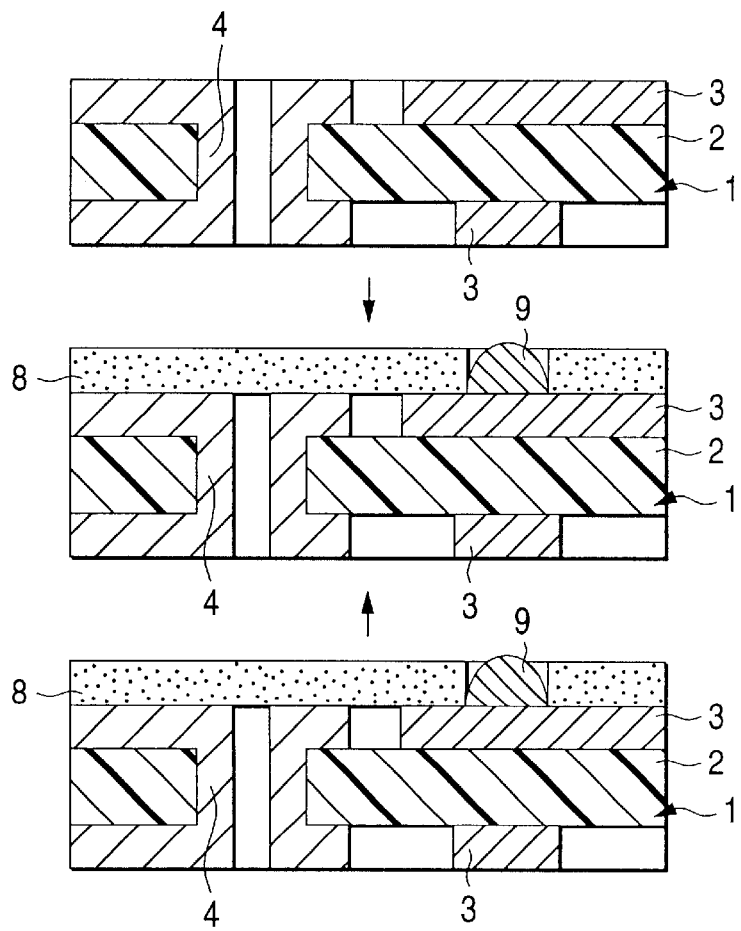
FIG. 6 is a cross-sectional view showing the state that a plurality of double-sided circuit substrates are laminated.
Figure 9:
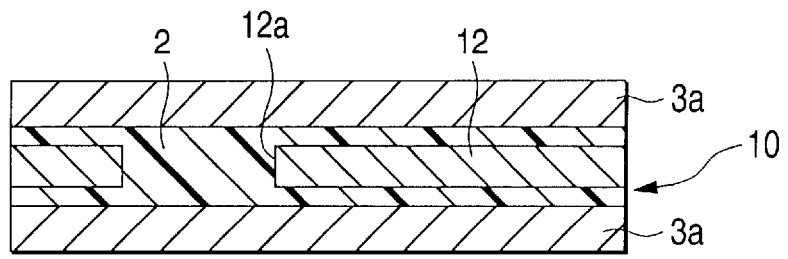
FIG. 9 is a cross-sectional view of the substrate.
Figure 10:
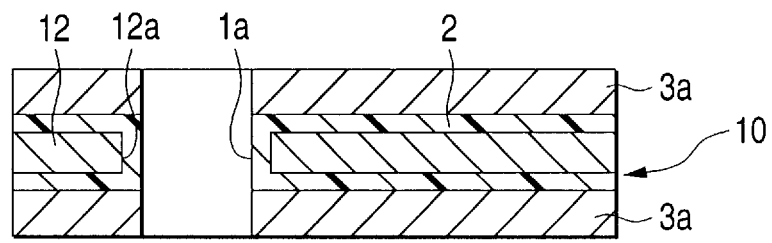
FIG. 10 is a cross-sectional view showing the state that a hole is formed in the substrate.
Figure 11:
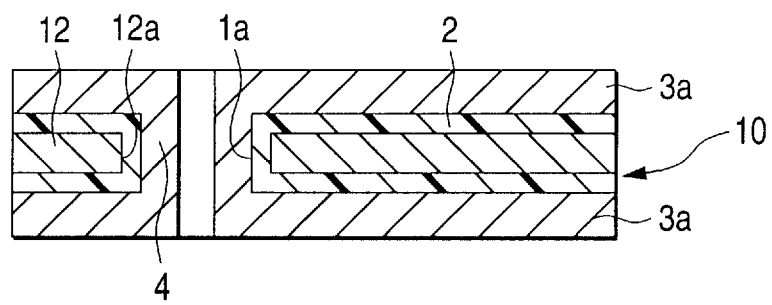
FIG. 11 is a cross-sectional view showing the state that the substrate has a plated through hole.

In this embodiment, the double-sided circuit substrate 1 can be produced as follows. A hole 12a is formed at a predetermined position (the position of forming a through-hole plated portion) of the Ni—Fe-based alloy foil 12, and a conductive layer 3a is adhered to both surfaces of the Ni—Fe-based alloy foil 12 using a polyimide-based adhesive (which becomes an insulating layer 2 of the substrate 10) to prepare the substrate 10 as shown in FIG. 9. As shown in FIG. 10, a hole 1a smaller than the hole 12a is formed in the portion corresponding to the hole 12a of the Ni—Fe-based alloy foil 12 of the substrate, and as shown in FIG. 11, the conductive layers 3a formed at both surfaces of the substrate are electrically connected by a throughhole plated portions 4 formed by applying copper plating to the hole 1a. Since the thermal expansion coefficient of the substrate 10 thus obtained is controlled by the Ni—Fe-based alloy which is the material of the core material, the thermal expansion coefficient can be controlled by changing the ratio of Ni to Fe and the thickness of the alloy foil. A circuit 3a is formed in each conductor layer 3a formed on both surfaces of the substrate 10 shown in FIG. 11 to prepare a double-sided circuit substrate 1 (see FIG. 3). Thereafter, a six-layer wiring substrate is produced in the same manner as shown in FIG. 4 to FIG. 6.

As described above, even in this embodiment, the three double-sided circuit substrates 1 can be integrated in a body by one heat-pressing, and at the same time, the electric connection among the six layers can be performed, similar to the embodiment shown in FIG. 1. Further, because the Ni—Fe-based alloy foil is disposed at a ratio of one layer to the circuit 3 of two layers, the thermal expansion coefficient of the entire six-layer wiring substrate can be greatly decreased even in the case of constituting the circuit 3 with a copper foil, and a very high connection reliability can be obtained. Also, since a solder is used, the connection among the low-resistant six layers can be performed. Moreover, since the throughhole plated portion 4 is formed in each double-sided circuit substrate 1, the electric connection among the six layers can be performed at a desired position by desirably setting the position of each throughhole plated portion 4 and the position of each solder-made conductor 6, whereby the degree of freedom for design is greatly increased. Further, in this embodiment, the multilayer wiring substrate having a very low thermal expansion coefficient can be obtained.

Further, a titanium foil can be used as a core material in place of Ni—Fe-based alloy foil. The titanium foil has a relatively small thermal expansion coefficient, so that a multilayer wiring substrate having light weight and excellent corrosion resistance can be produced.

Figure 12:
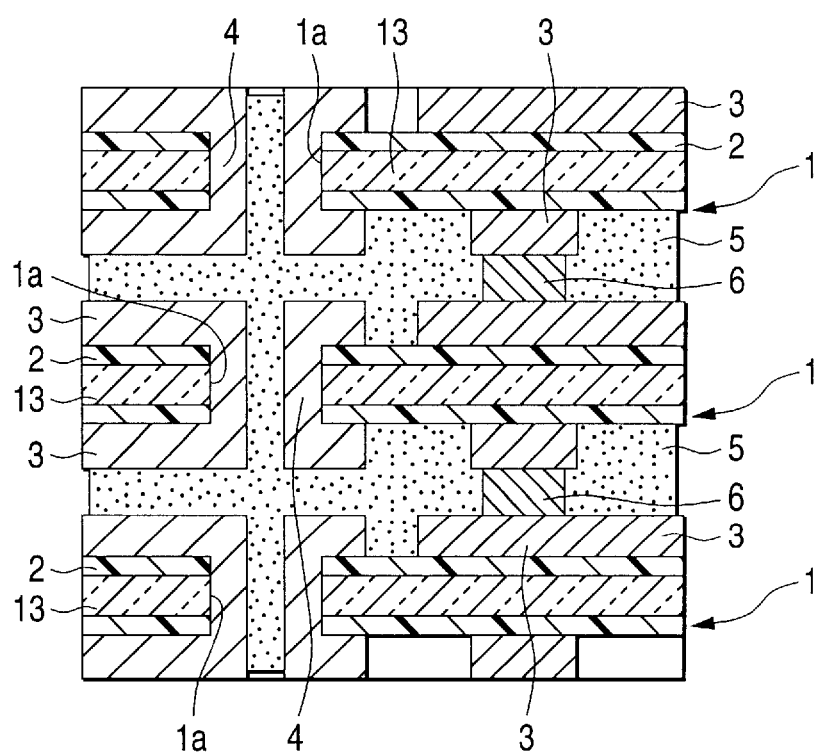
FIG. 12 is a cross-sectional view showing still another embodiment of the multilayer wiring substrate of the present invention.

FIG. 12 shows still another embodiment of the multilayer wiring substrate of the present invention. In this embodiment, a sheet 13 made up of a ceramic material such as alumina is disposed in an insulating layer 2 of each double-sided circuit substrate 1. Other portions are the same as those of the multilayer wiring substrate shown in FIG. 1 and the same portions are shown by the same reference numbers.

Figure 8:
FIG. 8 is a cross-sectional view of the core.

In this embodiment, the double-sided circuit substrate 1 can be prepared in the same manner as in the above-described another embodiment. Since the ceramic material such as alumina is an insulator, it is not necessary to form the hole 12a as shown in FIG. 8 in the sheet 13. The same action and effect as obtained in the above-described another embodiment are obtained in this embodiment. Further, since in this embodiment it is not necessary to form the hole 12a as shown in FIG. 8 in the sheet 13, production steps of the double-sided circuit substrates 1 become simple.

The present invention will be described in more detail by reference to the following examples, but it should be understood that the invention is not construed as being limited thereto.

EXAMPLE 1

Figure 13:
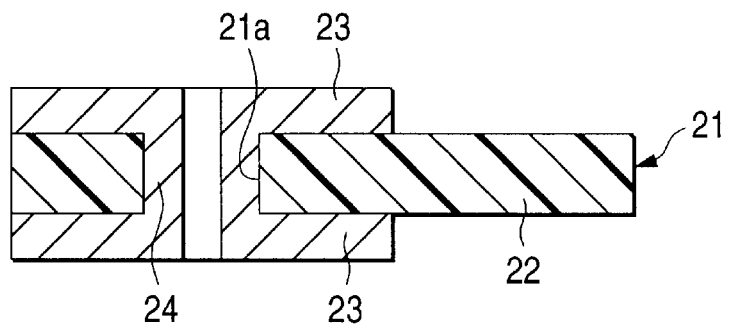
FIG. 13 is a cross-sectional view of the double-sided circuit substrate of Example 1.
Figure 14:
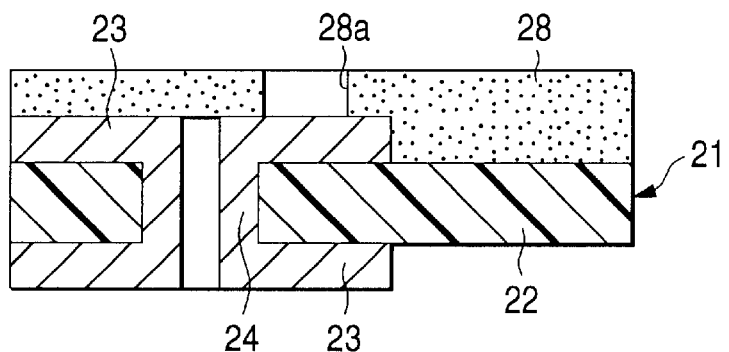
FIG. 14 is a cross-sectional view showing the state that an adhesive sheet is temporarily adhered to the double-sided circuit substrate.
Figure 15:
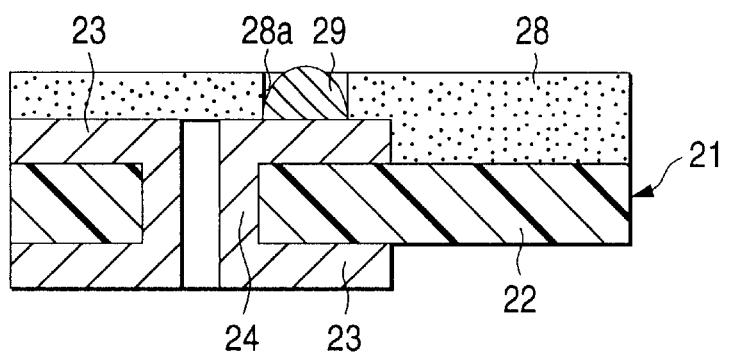
FIG. 15 is a cross-sectional view showing the state that a solder bump is formed in the adhesive sheet.
Figure 16:
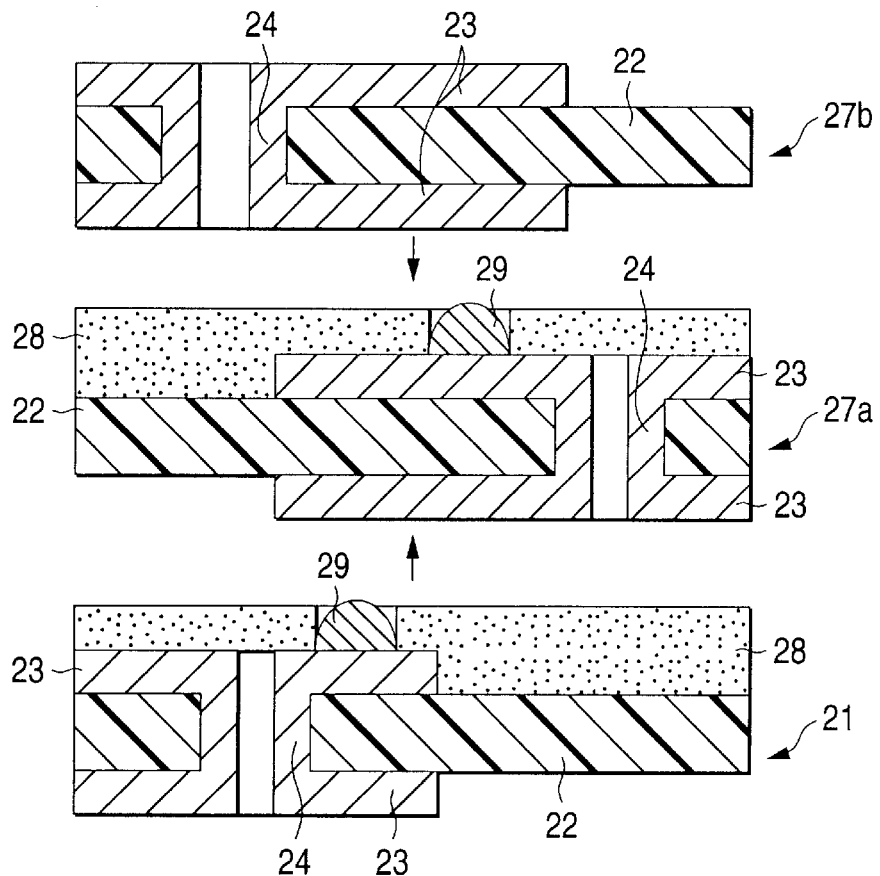
FIG. 16 is a cross-sectional view showing the state that a plurality of double-sided circuit substrates are laminated.
Figure 17:
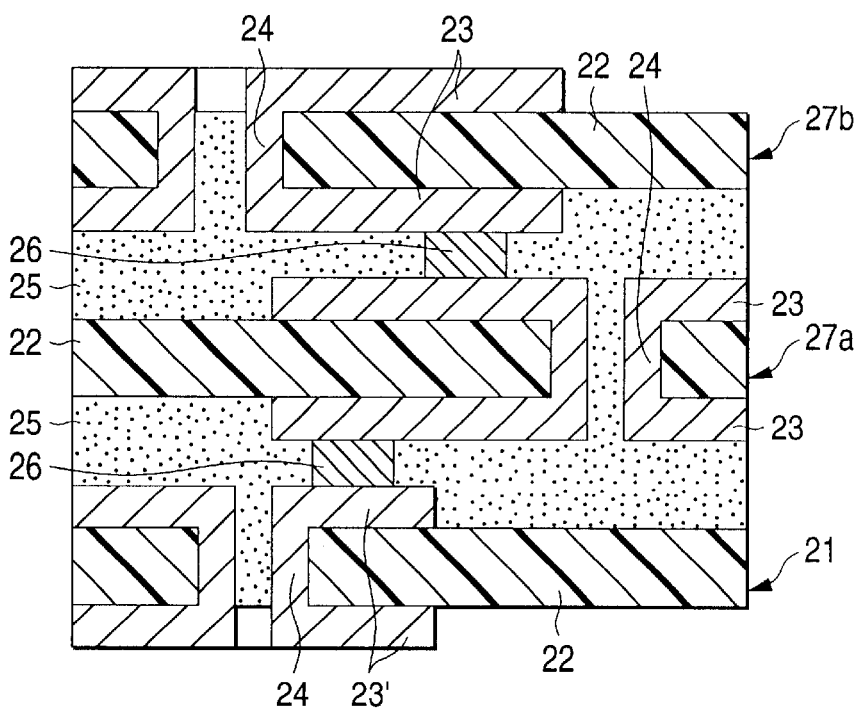
FIG. 17 is a cross-sectional view showing the six-layer wiring substrate of Example 1.

A hole 21a was formed by a drill having a diameter of 0.2 mm on the predetermined portion of a double-sided copper-laminated polyimide substrate (NEOFLEXNEX-231R, trade name, made by Mitsui Toatsu Chemicals, Inc.) having on both surfaces thereof a copper foil with a thickness of 18 $\mu$m and having an insulating layer 22 made up of a polyimide resin with a thickness of 50 $\mu$m. Through hole plating with copper was conducted to have a plating thickness of 5 $\mu$m (a throughhole plated portion 24 was formed), and a circuit 23 was formed in each copper foil layer on both surfaces of the substrate by a conventional etching method to prepare a double-sided substrate 21 (see FIG. 13). A polyimide-based adhesive sheet 28 (SPB-035A, trade name, made by Nippon Steel Chemical Co., Ltd.) having a hole 28a made by a drill having a diameter of 0.2 mm was placed on the double-sided substrate 21 while position-matching, and in this state, the adhesive sheet was adhered by heat-pressing (30 minutes at 30 kg/cm$^2$ and 180° C.) (see FIG. 14). A solder paste (Sn8RA-3AMQ, trade name, made by Nippon Speria K.K., melting point 260° C.) was filled up in the hole portion 28a of the adhesive sheet 28 by screen printing, and after reflowing at 290° C., the flux was removed by washing to form a solder bump 29 (see FIG. 15). Other double-sided circuit substrate 27a equipped with a solder bump 29 and double-sided circuit substrate 27b having formed circuits 23 only (see FIG. 16) were produced in the same manner as above. Those three substrates were position-matched, laminated and integrated in a body by heat-pressing (for 1 hour at 30 kg/cm$^2$ and 200° C.) to prepare a six-layer wiring substrate (see FIG. 17). In FIG. 17, 25 is an adhesive layer formed by the adhesive sheet 28, and 26 is a solder conductor formed by the solder bump 29.

EXAMPLE 2

Figure 18:
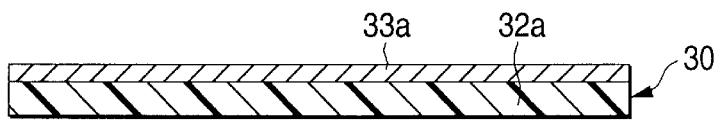
FIG. 18 is a cross-sectional view of the two-layer substrate of Example 2.
Figure 19:
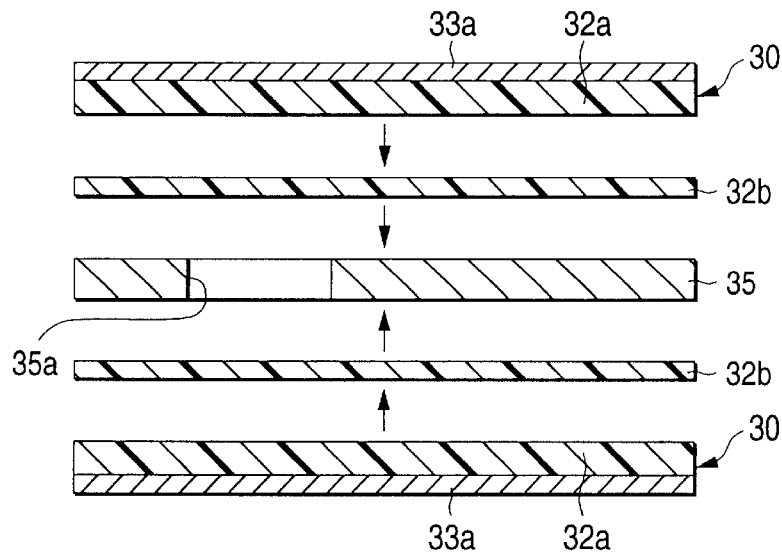
FIG. 19 is a cross-sectional view showing the production outline of a low expansion coefficient double-sided substrate.
Figure 20:
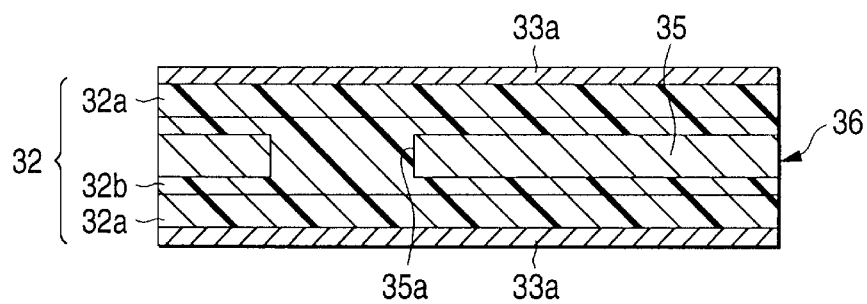
FIG. 20 is a cross-sectional view of the low expansion coefficient double-sided substrate.
Figure 21:
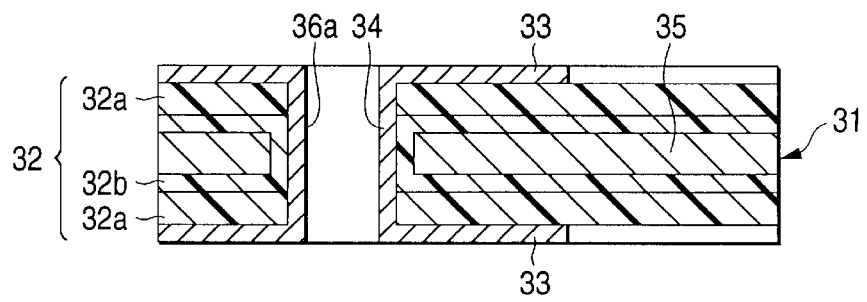
FIG. 21 is a cross-sectional view showing the state that the low-expansion double-sided substrate has a plated through-hole.

A polyimide precursor varnish (a polyamic acid varnish obtained by reacting p-phenylenediamine and 3,3',4,4'-biphenyl tetracarboxylic acid dianhydride in n-methyl pyrrolidone) was coated on a copper foil 33a having a thickness of 18 $\mu$m, dried and imidated in a nitrogen atmosphere for 1 hour at 400° C. to form a polyimide layer 32a having a thickness of 20 $\mu$m in thickness, thereby preparing a two-layer substrate 30 of copper and polyimide (see FIG. 18). Each of the thus-obtained two-layer substrates 30 was adhered by heat-pressing (for 1 hour at 40 kg/cm$^2$ and 200° C.) to both surfaces of a 42 alloy foil (42% by weight nickel and 58% by weight iron, the thermal expansion coefficient: 4.5 ppm/° C.) with a thickness of 50 $\mu$m, having a hole 35a made by a drill having a diameter of 0.3 mm at a predetermined position using each polyimide-based adhesive sheet 32b (SPB-035A, trade name, made by Nippon Steel Chemical Co., Ltd.) (see FIG. 19) to prepare a low-thermal expansion double-sided substrate 36 shown in FIG. 20. In the low-thermal expansion double-sided substrate 36, an insulating layer 32 was formed by the polyimide layers 32a and the polyimide-based adhesive sheet 32b. Furthermore, a throughhole 36a was formed at the same position as the hole 35a of the 42 alloy foil 35, using a drill having a diameter of 0.2 mm. Throughhole plating of copper (forming a throughhole plated portion 34) was conducted in the same manner as in Example 1, and circuits 33 were formed to prepare a double-sided circuit substrate 31. Similar to Example 1, an adhesive sheet was temporarily adhered, a solder bump was formed, the assembly was integrated in a body by heat-pressing, and the electric connection among the layers was carried out to prepare a six-layer wiring substrate.

EXAMPLE 3

A six-layer wiring substrate was prepared in the same manner as in Example 2 except that a 36 alloy foil (36% by weight nickel and 64% by weight iron, thermal expansion coefficient: 1.5 ppm/° C.) was used in place of the 42 alloy foil.

EXAMPLE 4

A two-layer substrate of copper and polyimide prepared in the same manner as in Example 2 was adhered by heat-pressing (for 60 minutes at 40 kg/cm° C. and 200° C.) to both surfaces of an aluminum nitride sheet (AlN, thermal expansion coefficient: 4.3 ppm/° C.) with a thickness of 200 $\mu$m using each polyimide-based adhesive sheet (SPB-035A, trade name, made by Nippon Steel Chemical Co., Ltd.) to prepare a low-thermal expansion double-sided substrate. A throughhole was formed in the low-expansion double-sided substrate using a drill having a diameter of 0.2 mm. Throughhole plating of copper was conducted in the same manner as in Example 1, and circuits were formed to prepare a double-sided substrate. Similar to Example 1, an adhesive sheet was temporarily adhered, a solder bump was formed, the assembly was integrated in a body by heat-pressing, and an electric connection among the layers was performed to prepare a six-layer wire substrate.

EXAMPLE 5

A six-layer wiring substrate was prepared in the same manner as in Example 2 except that a pure titanium foil (thermal expansion coefficient: 8.8 ppm/° C.) having a thickness of 50 $\mu$m was used.

It was confirmed that each of the multilayer wiring substrates of Examples 1 to 4 prepared above was composed of a six-layer conductor layer and the connection among the layers could be performed at optional positions. Further, the above-describe methods were not a method of successively piling up but a method that lamination could be carried out by one procedure. Therefore, the production steps were greatly simplified.

On the other hand, when the thermal expansion coefficient of each of the six-layer wiring substrates of Examples 1 to 4 was measured in the range of from room temperature (25° C.) to 200° C., the following results were obtained.

TABLE

| | Thermal Expansion Coefficient (ppm/° C.) |
|---|---|
| Example 1 | 17.0 |
| Example 2 | 7.5 |
| Example 3 | 4.0 |
| Example 4 | 5.5 |
| Example 5 | 11.0 |

As shown in the above Table, the thermal expansion coefficient of each of the six-layer wiring substrates of Example 2 to 4 using the Ni—Fe-based ally foil or the ceramic material as the core material is very small, and it is apparent that these substrates are suitable for bare chip mounting.

As described above, according to the method of producing the multilayer wiring substrate of the present invention, an adhesive sheet is position-matched to a double-sided circuit substrate and is temporarily adhered thereto, a solder bump is formed in the hole portion formed in the adhesive sheet, and the double-sided circuit substrates are piled up after position-matching and are integrated in a body by heat-pressing. Therefore, a plurality of double-sided substrates can be integrated in a body by one heat-pressing and at the same time, even where the wiring conductors comprise many layers, the electric connection among the many wiring conductors can be performed by one heat-pressing. Further, the multilayer wiring substrate of the present invention is that a plurality of double-sided circuit substrates are laminated via each adhesive layer and integrated in a body, and a hole is formed in the adhesive layer at a predetermined position of the portion contacting the wiring conductor of each of two double-sided circuit substrates holding the adhesive layer between them and a solder-made conductor. Therefore, the substrate which has a low connection resistance, a small thickness type, a high performance and a high connection reliability can be obtained. Furthermore, a throughhole is formed in each of the double-sided circuit substrates to thereby electrically connecting the wiring conductors at both surfaces of the double-sided circuit substrate. Therefore, the electric connection among the wiring conductors can be carried out at a desired position by desirably setting the position of the throughhole and the position of the solder conductors.

Further, in the present invention, where each of the insulating layers contains an Ni—Fe-based alloy foil, a titanium foil or a ceramic material as the core material, the core material having a low expansion coefficient made up of the Ni—Fe-based alloy foil, the titanium foil or the ceramic material is contained at a ratio of one layer to two layers of the wiring conductors. Where copper is used as the wiring conductors, it is possible to approach the thermal expansion coefficient of the entire multilayer substrate to that of silicon as close as possible.

As describe above, where each insulating layer contains the Ni—Fe-based alloy foil, the titanium foil or the ceramic material as the core material, the thermal expansion coefficient of the multilayer wiring substrate can be greatly decreased. As a result, the multilayer wiring substrate of the present invention has a very high connection reliability in bare chip mounting.

While the invention has been described in detail and with reference to specific embodiments thereof, it will be apparent to one skilled in the art that various changes and modifications can be made therein without departing from the spirit and scope thereof.

What is claimed is:

1. A method of producing a multilayer wiring substrate, which comprises the steps of:

preparing a plurality of double-sided circuit substrates each comprising an insulating layer which comprises an organic high molecular weight resin having formed on both surfaces thereof wiring conductors, both the wiring conductors being electrically connected by a throughhole, and an adhesive sheet having holes at positions corresponding to definite portions of the wiring conductors of the double-sided circuit substrates;

temporarily adhering the adhesive sheet to the double-sided circuit substrates in a state that the holes of the adhesive sheet are position-matched with the definite portions of the wiring conductors of the double-sided circuit substrates, filling up the holes of each adhesive sheet with a solder paste and heat-melting the solder paste to form a solder bump; and position-matching such that the wiring conductors of the double-sided circuit substrates can be electrically connected in a predetermined manner, piling up the double-sided circuit substrates, and then heat-pressing a resulting assembly to integrate into a body.

2. The method as claimed in claim 1, wherein the insulating layer comprising an organic high molecular weight resin comprises a polyimide-based resin.

3. The method as claimed in claim 1, wherein the adhesive layer comprises a polyimide-based adhesive.

4. The method as claimed in claim 1, wherein the insulating layer comprising a high molecular resin contains an Ni—Fe-based alloy foil, a titanium foil or a ceramic material sheet as a core material.

5. The method as claimed in claim 4, wherein the Ni—Fe-based alloy foil has Ni content of 31 to 50% by weight.

6. The method as claimed in claim 4, wherein the core material has a thickness of 10 to 300 $\mu$m.

* * * * *